US010356912B2

(12) United States Patent
Dobriyal et al.

(10) Patent No.: US 10,356,912 B2
(45) Date of Patent: Jul. 16, 2019

(54) APPARATUS AND METHOD FOR CONFORMAL COATING OF INTEGRATED CIRCUIT PACKAGES

(71) Applicant: Intel Corporation, Santa Clara, CA (US)

(72) Inventors: Priyanka Dobriyal, Hillsboro, OR (US); Suriyakala Ramalingam, Chandler, AZ (US); Chester C. Lee, Hillsboro, OR (US); Raiyomand F. Aspandiar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 48 days.

(21) Appl. No.: 15/257,726

(22) Filed: Sep. 6, 2016

(65) Prior Publication Data

US 2018/0070456 A1    Mar. 8, 2018

(51) Int. Cl.
*H05K 1/18* (2006.01)
*H05K 3/28* (2006.01)
*H01L 21/56* (2006.01)

(52) U.S. Cl.
CPC .......... *H05K 3/284* (2013.01); *H01L 21/563* (2013.01); *H05K 1/18* (2013.01); *H05K 2201/09872* (2013.01)

(58) Field of Classification Search
CPC ...... H05K 1/141–1/144; H05K 1/0231; H01L 2924/01078–2924/01079; H01L 23/3135; H01L 23/552
USPC ............... 361/760–784, 803; 174/258–264, 174/520–523; 257/728–730, 787–790
See application file for complete search history.

(56) References Cited

U.S. PATENT DOCUMENTS

| 7,382,005 B2 * | 6/2008 | Lin ................... H01L 24/11 257/288 |
| 2002/0041489 A1 * | 4/2002 | Fritz ................ H01L 23/49827 361/767 |
| 2012/0069523 A1 | 3/2012 | Kapusta et al. |
| 2012/0153009 A1 | 6/2012 | Kitamura et al. |
| 2013/0037923 A1 * | 2/2013 | Yoo ................... H01L 23/552 257/659 |
| 2013/0075139 A1 | 5/2013 | Wang et al. |
| 2014/0131900 A1 * | 5/2014 | Haba ................ H01L 23/3135 257/786 |
| 2014/0346533 A1 * | 11/2014 | Andrews ............. H01L 25/0753 257/88 |

(Continued)

FOREIGN PATENT DOCUMENTS

JP    2013004648 A    1/2013

OTHER PUBLICATIONS

International Search Report and Written Opinion dated Nov. 15, 2017 for International Application No. PCT/US2017/045611, 12 pages.

*Primary Examiner* — Tuan T Dinh
(74) *Attorney, Agent, or Firm* — Schwabe, Williamson & Wyatt, P.C.

(57) ABSTRACT

An electronic system includes a printed circuit board (PCB), a component affixed to the PCB, and a conformal coating layer on the PCB and the component. The conformal coating layer includes parylene. Furthermore, the electronic system includes an underfill layer adjacent to the conformal coating layer, filling a gap between the PCB and the component. Other embodiments being described and/or claimed.

20 Claims, 8 Drawing Sheets

(56) References Cited

U.S. PATENT DOCUMENTS

2016/0133550 A1  5/2016  Chen

* cited by examiner

APPARATUS AND METHOD FOR CONFORMAL COATING OF INTEGRATED CIRCUIT PACKAGES

TECHNICAL FIELD

The present disclosure relates to the field of electronic circuits. More particularly, the present disclosure relates to an electronic system including integrated circuit packages assembled on a printed circuit board (PCB).

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

An electronic system may often include various electronic components and sub-systems assembled or integrated on a printed circuit board (PCB), where the PCB may provide mechanical support, while electrically connecting electronic components using conductive tracks, pads and other features built onto a non-conductive substrate. Assembly of an electronic system, e.g., using PCBs, may be performed with consideration given to protection from mechanical damage, cooling, radio frequency noise emission, protection from electrostatic discharge, maintenance, operator convenience, and cost. Electronic systems for aerospace, marine, or military systems may impose different types of design criteria for assembling or integration on PCBs.

Wearable devices and Internet of Things (IoT) devices and systems, such as fitness tracker, headsets etc., may benefit from protections such as impermeability to water, resistance to corrosion, and support for high impact. For example, a fitness tracker collecting data on a user's vital signs while swimming may not work if water protection is not applied to the fitness tracker. Similarly, boards used for skateboards may be damaged without protection for withstanding high impact. However, current techniques for water protection and high impact protection for electronic systems using PCBs may have high costs and lack of flexibility.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 6 illustrates an example computing device that may employ the apparatuses and/or methods described herein.

DETAILED DESCRIPTION

Printed circuit boards (PCBs) may be widely used in electronic products and systems. Surface-mount technology (SMT) may refer to a technique for producing electronic devices, products, and systems in which the components are mounted or placed directly onto the surface of PCBs. An electronic device so made may be called a surface-mount device (SMD).

PCBs intended for harsh and stressful environments may often have a conformal coating and an underfilling. The term "conformal coating" may refer to a conformal coating layer. Similarly, the term "underfilling" may refer to an underfilling layer, or an underfill layer. Conformal coatings may provide a barrier to air-borne contaminants from the operating environment, preventing attack from moisture, aggressive chemicals, salt sprays, etc., which may cause corrosion and leakage currents or shorting due to condensation. Similarly, underfilling increases the robustness of solder joints and hence product life in an electronic device assembled using PCBs.

The underfilling may be used on the solder joints of certain packages. On the other hand, the conformal coating may be applied by dipping or spraying after the components have been soldered. The conformal coating may be wax, silicone rubber, polyurethane, acrylic, or epoxy. Another technique for applying a conformal coating may be by vapor pressure deposition (VPD) onto the PCB in a vacuum chamber. Those conformal coatings may not consider the underfilling impact to the PCB and components affixed to the PCB.

In some electronic devices, e.g., some high end premium products, both the conformal coating and the underfilling may be applied. Applying the conformal coating and the underfilling separately may lead to a considerable amount of time and resources for the overall cost of making both the conformal coating and the underfilling. In addition, there may be a rework process performed for an electronic device assembled on a PCB. For example, ball grid array (BGA) packages may have particular rework challenges due to the input/output (I/O) pins being located under the package with a limited ability to focus heat on the solder connecting the I/Os to the PCB.

In embodiments, apparatuses and processes for assembling electronic systems using PCBs are disclosed herein. For example, processes herein may combine both conformal coating and underfilling aspects, while enabling rework, during the surface-mount process. Hence, processes herein may save cost, and reduce the time to market (TTM), for assembling electronic systems using PCBs.

In more details, an electronic system may include a PCB, a component affixed to the PCB, and a conformal coating layer on the PCB and the component. The conformal coating layer may include parylene, e.g., parylene C. The use of parylene as the conformal coating layer may function as a conformal coating layer and also function as a second underfill layer in conjugation with any thermally reworkable underfill layer. The PCB having a parylene conformal coating layer may increase the resistance to harsh environmental conditions, and thereby enhance overall product life.

Furthermore, the electronic system may include an underfill layer adjacent to the conformal coating layer, filling a gap between the PCB and the component. Such an underfill layer may function as a thermally reworkable underfill layer. The component affixed to the PCB may include a package or a passive component, e.g., a capacitor, or a resistor. The package may be a chip scale package, a wafer-level package, a quad-flat no-leads package, a dual-flat no-leads package, a package with overmold mounted on the PCB, and/or some other type of package. There may be a release agent layer between the PCB and the conformal coating layer to facilitate a rework process for the component.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The description may use the phrase "communicatively coupled." The phrase may mean that an electrical signal may propagate among the elements that are communicatively coupled.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1A:
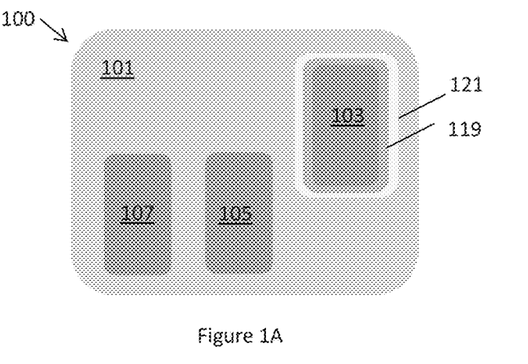
FIGS. 1A and 1B illustrate a top view and a cross section view of an example electronic system assembled on a printed circuit board (PCB) with a conformal coating layer, according to various embodiments.
Figure 1B:
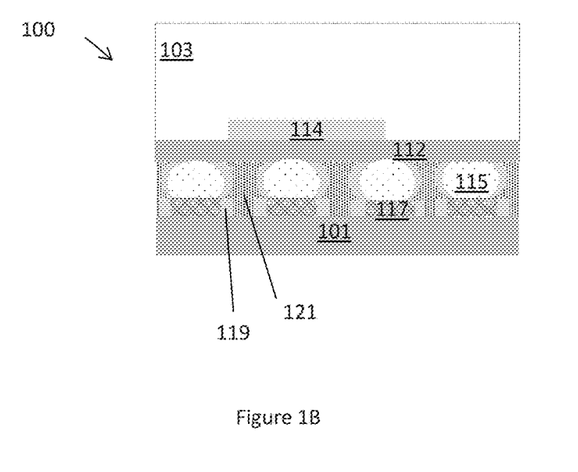

FIGS. 1A and 1B illustrate a top view and a cross section view of an example electronic system assembled on a PCB with a conformal coating layer, according to various embodiments. The electronic system 100 may include a PCB 101, and an integrated circuit package 103. Additional components such as a component 105 and another component 107, e.g., passive components, may be included as well. For clarity, features of the electronic system 100 are described below as an example for understanding an example electronic system that may be assembled using a PCB. It is to be understood that there may be more or fewer packages or components affixed to the PCB 101. Further, it is to be understood that one or more of the packages and components within the electronic system 100 may include additional and/or varying features from the description below, and may include any device that one having ordinary skill in the art would consider and/or refer to as an electronic system.

The electronic system 100 may include the PCB 101, with components affixed to the PCB, e.g., a package 103, a component 105, and another component 107. The component 105 and the component 107 may include active devices, or passive components such as capacitors, resistors. The package 103, the component 105, and the component 107 may be soldered on the PCB 101. The electronic system 100 may be a wearable device or an IOT device, such as a fitness tracker.

The PCB 101 may include any type of PCB known to one having ordinary skill in the art. For example, the PCB 101 may be a rigid PCB or a flex PCB. In embodiments, the PCB 101 may contain components embedded in its substrate, not shown. Furthermore the PCB 101 may be single sided (one copper layer), double sided (two copper layers), multi-layer (outer and inner layers), and/or some combination thereof. Conductors on different layers of the PCB 101 may be connected with vias.

In more detail, the package 103 may include a substrate 112. The substrate 112 may be a polymeric substrate, or a non-polymeric substrate. Other devices such as a die 114 may be packaged onto the substrate 112. The package 103 may be a chip scale package (CSP), a wafer-level package (WLP), a quad-flat no-leads (QFN) package, a dual-flat no-leads (DFN) package, an area array device, or a package with overmold mounted on the PCB. A CSP may be a flip chip device including solder balls or bumps that are approximately 250 μm tall. An area array device may be a BGA package. A wafer-level package may be a package at a wafer level, instead of individual dies obtained from dicing them from a wafer. Both QFN and DFN packages may refer to packages that connect ICs to the surfaces of PCBs without through-holes.

As shown in FIG. 1B, the package 103 may be connected to the PCB 101 by the BGA 115. In embodiments, the BGA 115 may include one or more solder balls, where the solder balls may include solder alloy such as tin-lead (Sn—Pb) solders or lead free solders (Sn/Ag/Cu)). In some embodiments, the BGA 115 may be aligned with contacts 117 on the PCB 101 and may communicatively couple the package 103 to the traces of the PCB 101.

A conformal coating layer 119 may be coated on the PCB 101 and the package 103, but may leave some components uncovered. For example, as shown in FIG. 1A, the component 105 and the component 107 may not be covered by the conformal coating layer 119. The conformal coating layer 119 may include parylene, e.g., parylene C. The conformal coating layer 119 may also be coated on the connectors such as ball grid array (BGA) 115 and the contacts 117 under the packages, as shown in FIG. 1B.

In embodiments, the conformal coating layer may be formed by applying vapor deposition polymerization (VPD) to parylene gas. The parylene gas may penetrate crevices and tight spaces, e.g., spaces as tight as 1 um, on multi-layer components, at least partially encapsulating the PCB and the component affixed on the PCB. In some embodiments, the parylene gas may provide a complete and uniform encapsulation of the PCB and the component affixed on the PCB. In embodiments, the conformal coating layer having parylene may be applied to PCBs or packages which have shields installed on them. Furthermore, parylene C may be compatible with both polymeric and non-polymeric substrates of packages. In addition, in embodiments, the conformal coating layer using parylene may have little to no impact on electrical property analysis during manufacturing of the electronic systems using the PCB.

The conformal coating layer may have a thickness in a range of about 4-15 microns, as measured in a direction perpendicular to a surface of the PCB covered by the conformal coating layer. For example, the surface may be the surface to which the package 103 and/or components 105 and 107 are attached. In embodiments, the conformal coating layer having parylene may provide moisture impermeability and corrosion resistance properties. More specifically, parylene C may provide a uniform conformal coating on an entire PCB when coating thickness is in a range of approximately 4 and approximately 15 microns. For example, in embodiments, parylene C may provide a uniform coating, e.g., 5 um thickness, across the PCB surface. In addition, the conformal coating layer having parylene C may provide a clear and transparent coating which may not be detected by the naked eye. Visually, there may be no difference between a coated and non-coated PCB when parylene C is used as the conformal coating layer.

An underfill layer 121 may be adjacent to the conformal coating layer 119, wherein the underfill layer is within a gap between the PCB and the package 103. The underfill layer 121 may include any material utilized in an underfill process known by one having skill in the art. For example, the underfill layer 121 may include an epoxy underfill, e.g., Zymet X2825C, Zymet X2968, Namics 1589, corner glue, or some other underfill material. The underfill layer 121 may fill the gap entirely between the PCB and the component, e.g., the package 103, and fully encircle the BGA 115. Alternatively, in some embodiments (not shown for the sake of clarity and redundancy), the underfill layer 121 may partially encircle the BGA 115.

Figure 2:
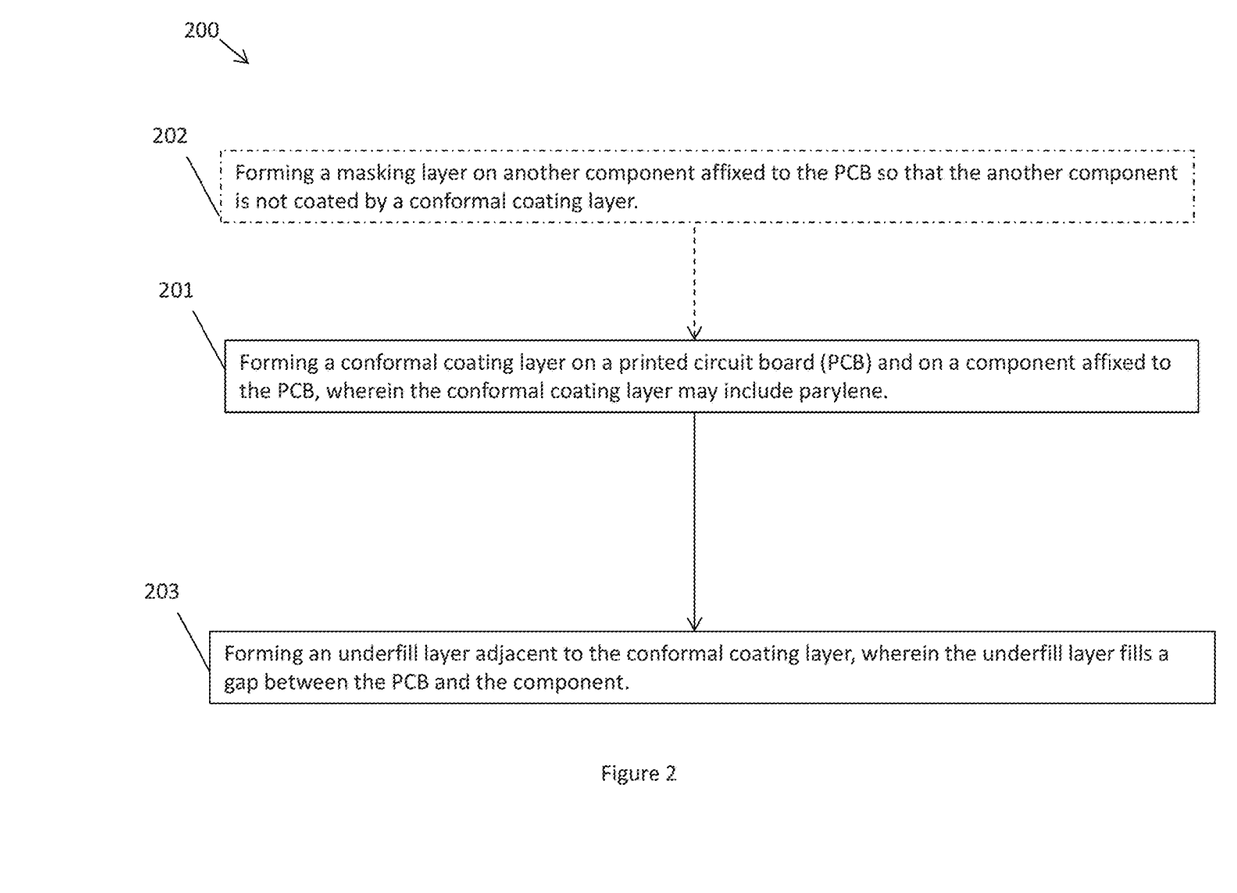
FIG. 2 illustrates an example assembling process of electronic systems including a PCB with a conformal coating layer, according to various embodiments.

FIG. 2 illustrates an example assembling process 200 of electronic systems using PCB with a conformal coating layer, according to various embodiments.

In operation 201, the process 200 may include forming a conformal coating layer on a PCB and on a component affixed to the PCB, wherein the conformal coating layer may include parylene. The component may be affixed to the PCB by any means of affixing a component to the PCB known by one having ordinary skill in the art. The operation 201 may be applied to a rigid PCB or a flex PCB. The conformal coating layer may include parylene C. The conformal coating layer may have a thickness in a range of about 4-15 microns, measured in a direction perpendicular to a surface of the PCB being covered by the conformal coating layer. The component affixed to the PCB may be a package, or a passive component, e.g., a capacitor or a resistor. The package may be a CSP, a WLP, a QFN package, a DFN package, or a package with overmold mounted on the PCB. In addition, the package may include a polymeric substrate or a non-polymeric substrate.

The conformal coating layer on the component and the PCB may be formed by any means of making a conformal coating layer known by one having ordinary skill in the art. For example, the conformal coating layer having parylene may be formed by operations including: vaporizing a solid dimer para-xylylene; causing pyrolisis of the vaporized dimer vapor to yield para-xylylene; and polymerizing the para-xylylene spontaneously on the PCB and the component affixed to the PCB.

Additionally or alternatively, in operation 202 before the operation 201, the process 200 may include forming a masking layer on a component affixed to the PCB so that the component is not coated by the conformal coating layer described above. The masking layer on the component may be formed by any means of masking a component known by one having ordinary skill in the art, using any materials for masking known by one having ordinary skill in the art. As a result of the masking, the conformal coating layer may be formed on components not masked, but not on any component having the masking layer.

Furthermore, in operation 203, the process 200 may include forming an underfill layer adjacent to the conformal coating layer, wherein the underfill layer at least partially fills a gap between the PCB and the component. The underfill layer may be formed by any means of forming an underfill layer known by one having ordinary skill in the art, using materials for an underfill layer known by one having ordinary skill in the art. For example, the underfill layer may include an epoxy underfill, e.g., Zymet X2825C, Zymet X2968, or Namics 1589. The underfill layer may fill a gap entirely between the PCB and the component and fully encircle the BGA. Alternatively, in embodiments, the underfill layer may partially encircle the BGA connecting the PCB and the component.

Figure 3:
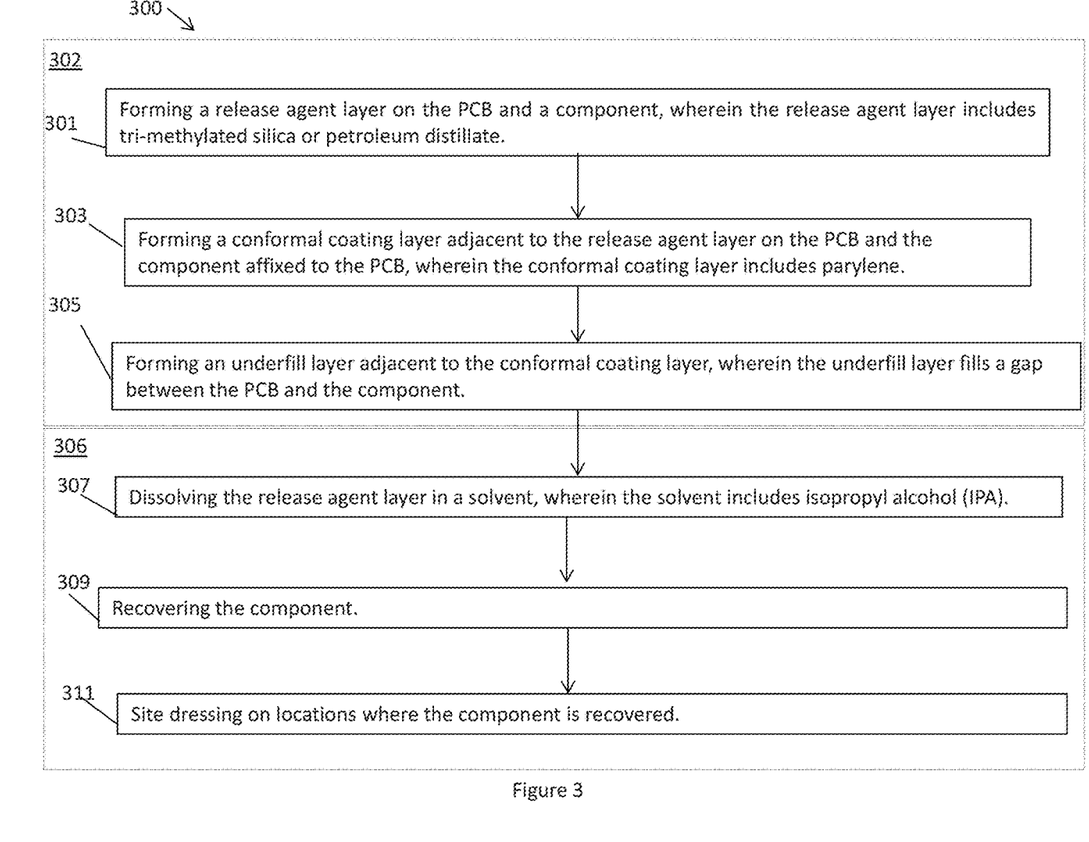
FIG. 3 illustrates an example assembling and reworking process of electronic systems using PCB with a conformal coating layer, according to various embodiments.

FIG. 3 illustrates an example assembling and reworking process 300 of electronic systems using a PCB, according to various embodiments. The process 300 may include operations for assembling components (block 302), and operations for reworking a package or a component on the PCB (block 306).

In embodiments, operations for assembling components shown in block 302, including operation 301, operation 303, and operation 305, may be similar to the process 200 shown in FIG. 2, with the addition of forming a release agent layer. More details are described in the following.

In operation 301, the process 300 may include forming a release agent layer on the PCB and a component. A release agent is a chemical used to prevent other materials from bonding to surfaces. In embodiments, application of release agents may produce low surface energy and a high contact angle surface. The release agent layer may be formed by any means of forming a release agent layer known by one having ordinary skill in the art, using materials known by one having ordinary skill in the art. For example, the release agent layer may include tri-methylated silica or petroleum distillate. A release agent may be applied to the component of interest, e.g., a package, with the help of a glass dropper. To prevent the escape of release agent elsewhere on the board, the surrounding area may be masked with copper tapes or even peelable ultraviolet (UV) curable maskant. Excess release agent may be cleaned with the help of isopropyl alcohol (IPA).

In operation 303, the process 300 may include forming a conformal coating layer adjacent to the release agent layer on the PCB and the component affixed to the PCB, wherein the conformal coating layer includes parylene. The operation 303 may be similar to the operation 201 in the process 200 to form the conformal coating layer, as shown in FIG. 2.

In operation 305, the process 300 may include forming an underfill layer adjacent to the conformal coating layer, wherein the underfill layer fills a gap between the PCB and the component. The operation 305 may be similar to the operation 203 in the process 200 to form the underfill layer, as shown in FIG. 2.

Components assembled using the operations shown in block 302 may increase the efficiency for the rework process of the PCB. "Rework" of a package or a component on a PCB may refer to a process to remove or insert the component of interest from or to the PCB. In embodiments, the removal process may be similar to the insertion process. In embodiments, a rework profile may be used for reworking a package or a component on a PCB. For example, the rework profile may include the characteristics of the PCB, the type and location of each component on the PCB, the connector used for connecting the component of interest to the PCB, along with its associated temperature profile. In embodiments, a user may generate a rework profile to remove/insert the component. Once generated, the rework profile may be used in a production environment to efficiently rework PCBs for which the component of interest is to be removed or inserted. In embodiments, the release agent layer formed in operation 301 and the conformal coating layer including parylene formed in operation 303 may facilitate rework by loosening the release agent layer in solvents such as IPA, followed by mechanical removing the component by pulling using tweezers during rework.

When reworking the PCB and a component, further operations may be performed as shown in block 306. For example, the process 300 may include: dissolving the release agent layer in a solvent, wherein the solvent may include IPA (307); recovering the component (309); and site dressing on locations, which may refer to the cleanup of the locations, where the components are recovered (311).

The operations described above for the block 306, e.g., the operation 307, the operation 309, and the operation 311, may be performed by any means to perform the operations known by one having ordinary skill in the art. For example, a process on record (POR) rework profile for package removal may be used in the reworking process. The conformal coating layer having parylene C may be removed by conventional surface-mount techniques, e.g., melting the conformal coating layer having parylene C at temperature of 290° C. In embodiments, other aggressive techniques, such as plasma etching or mechanical abrasion, may also be used to remove the conformal coating layer having parylene C. For removing the component, when the temperature reaches the melting point of solder joints, the component, e.g., the package, may be recovered by applying additional force by a pair of tweezers, so that no damage is seen on the board or package. Similarly, packages can be recovered when underfill is present.

The process 300 may have many advantages. For example, the process 300 may reduce TTM due to streamlining the process of forming a conformal coating layer and an underfill layer. Electronic systems integrated on PCBs according to the process 300 may be aesthetically pleasing because parylene C layer may be thin and optically transparent. In addition, the process 300 may enable rework of costly devices as well as PCBs during prototyping, and hence save cost across all products during prototyping due to the ability to rework expensive packages. The process 300 may also preserve the PCB and components during rework, so that a precise root cause analysis may be performed to solve manufacturing defect or field failures.

FIGS. 4A-4D illustrate in cross-section view an example application of the assembling process applied to an electronic system including a PCB, according to various embodiments. The assembling process applied may include the operations described in the block 302 of the process 300 shown in FIG. 3.

Figure 4A:
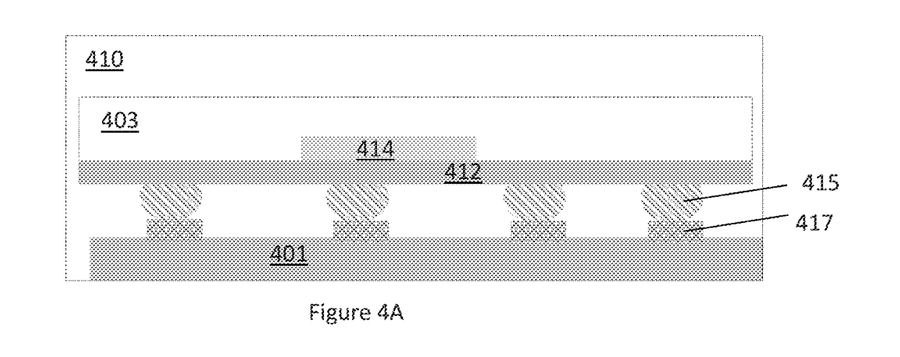
FIGS. 4A-4D illustrate in cross-section view an example application of the assembling process applied to an electronic system including a PCB, according to various embodiments.

Initially, as shown in FIG. 4A, an electronic system 410 may be provided. The system 410 may include a PCB 401. A package 403 may be mounted on the PCB 401. The package 403 may include a substrate 412 and a die 414. The package 403 may be affixed to the PCB 401 by connectors such as the connector 415 in contact with the pad 417.

Figure 4B:
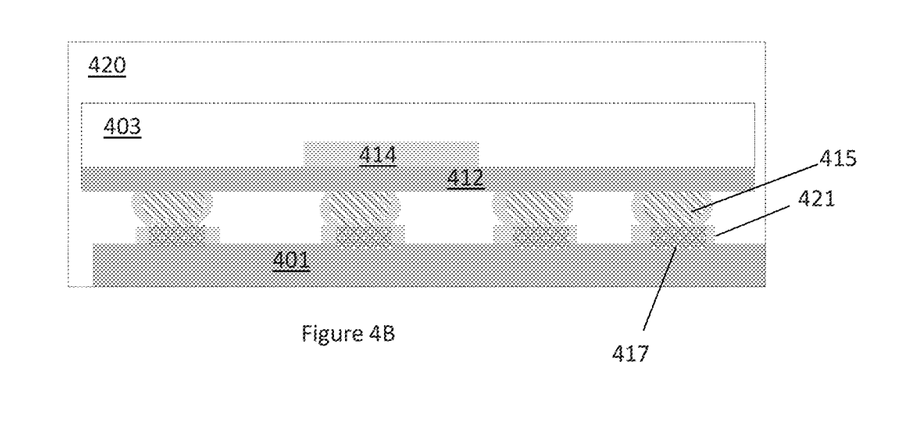

As shown in FIG. 4B, an operation, e.g., operation 301 of FIG. 3, may be performed on the system 410 to produce a system 420, where a release agent layer 421 may be formed on the package 403, the PCB 401, the connector 415, and the pad 417. The release agent layer 421 may be formed according to operation 301 as described in FIG. 3.

Figure 4C:
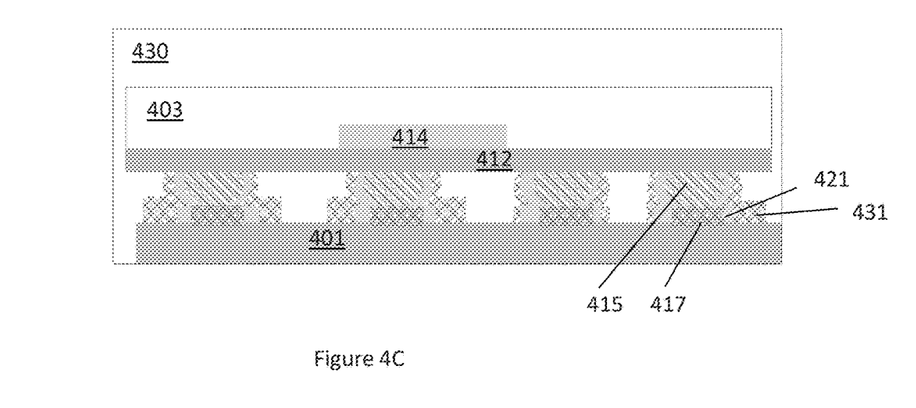

As shown in FIG. 4C, another operation, e.g., operation 303 of FIG. 3, may be performed on the system 420 to produce a system 430, where a conformal coating layer 431 may be formed on the package 403, the PCB 401, the connector 415, and the pad 417, adjacent to the release agent layer 421. The conformal coating layer 431 may be formed according to operation 303 as described in FIG. 3, or the operation 201 in FIG. 2. The conformal coating layer 431 may include parylene, e.g., parylene C.

Figure 4D:
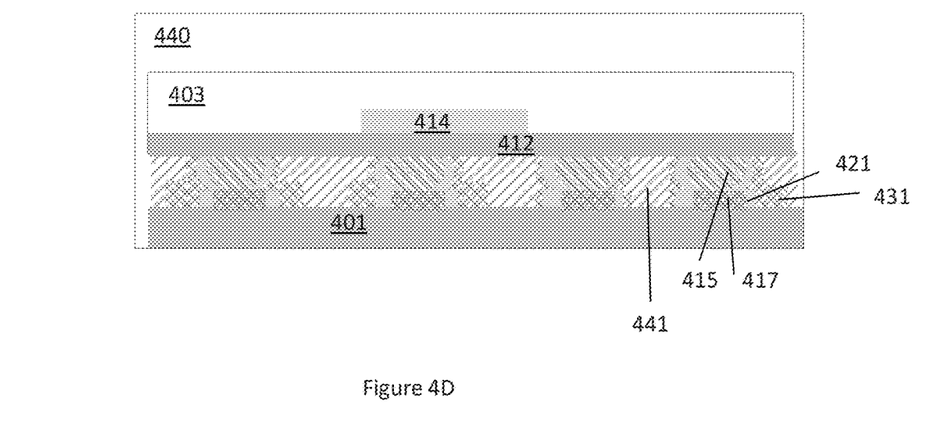

Furthermore, as shown in FIG. 4D, an operation, e.g., operation 305 of FIG. 3, may be performed on the system 430 to produce a system 440, where an underfill layer 441 may be formed on the package 403, the PCB 401, the connector 415, and the pad 417, adjacent to the conformal coating layer 431. The underfill layer 441 may be formed according to operation 305 as described in FIG. 3, or the operation 203 in FIG. 2. The underfill layer 441 may include an epoxy underfill. The formed underfill layer 441 may be cured in a heated oven.

FIGS. 5A-5E illustrate in top view an example application of the assembling and rework process applied to an electronic system including a PCB, according to various embodiments. The assembling and rework process applied may be the process 300 shown in FIG. 3.

Figure 5:
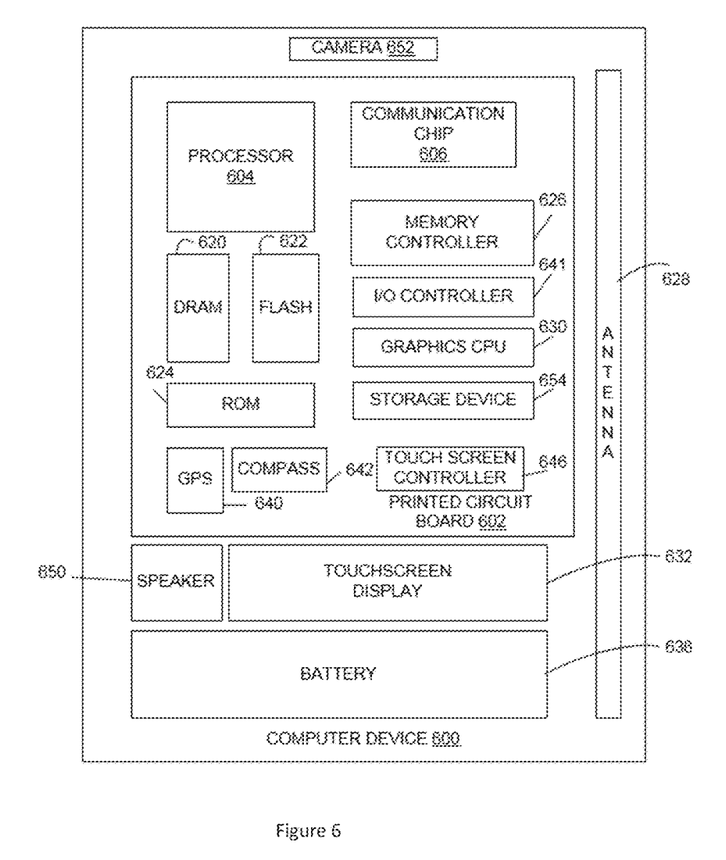
FIGS. 5A-5E illustrate in top view an example application of the assembling and reworking process applied to an electronic system including a PCB, according to various embodiments.
Figure 5A:
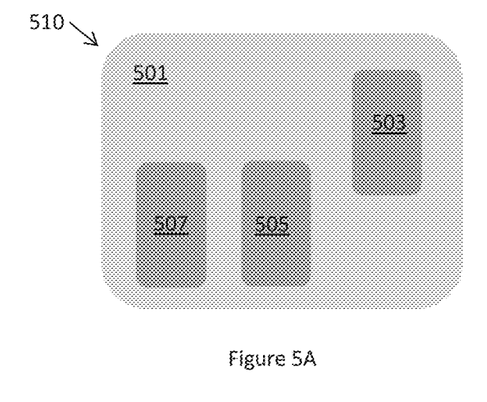

Initially, as shown in FIG. 5A, an electronic system 510 may be provided. The system 510 may include a PCB 501. A package 503 may be an area array device mounted on the PCB 501. In addition, a component 505 and another component 507 may be mounted on the PCB 501 as well. The component 505 or the component 507 may be other packages, or passive components, e.g., capacitors or resistors.

Figure 5B:
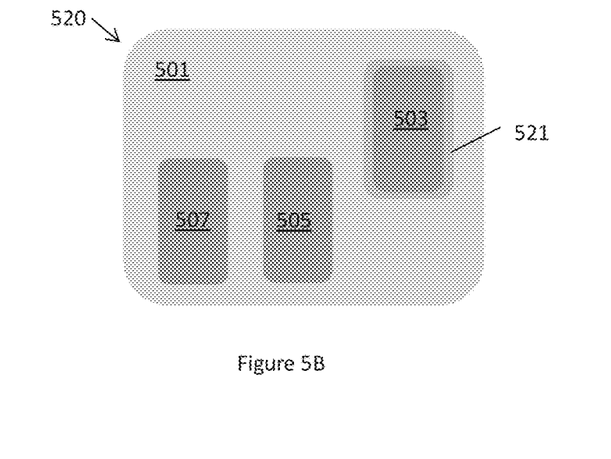

As shown in FIG. 5B, an operation, e.g., operation 301 of FIG. 3, may be performed on the system 510 to produce a system 520, where a release agent layer 521 may be formed on the package 503 and the PCB 501. The release agent layer 521 may also be formed on connectors, and pads between the PCB 501 and the package 503, not shown. In embodiment, the release agent layer 521 may not be formed on some components such as the component 505 and the component 507. The release agent layer 521 may be formed according to operation 301 as described in FIG. 3.

Figure 5C:
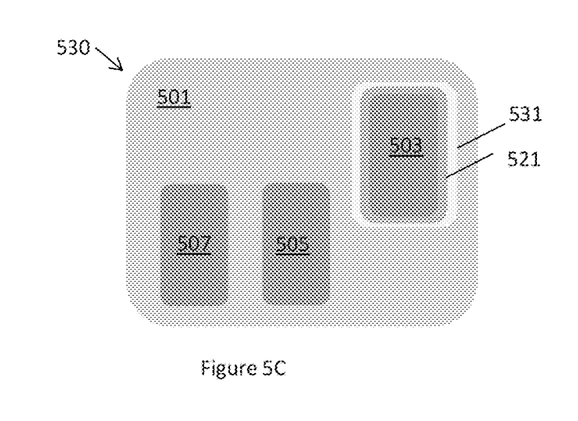

As shown in FIG. 5C, another operation, e.g., operation 303 of FIG. 3, may be performed on the system 520 to produce a system 530, where a conformal coating layer 531 may be formed on the package 503 and the PCB 501, adjacent to the release agent layer 521. In embodiment, the conformal coating layer 531 may not be formed on some components such as the component 505 and the component 507. The conformal coating layer 531 may be formed according to operation 303 as described in FIG. 3, or the operation 201 in FIG. 2. The conformal coating layer 531 may include parylene, e.g., parylene C.

Figure 5D:
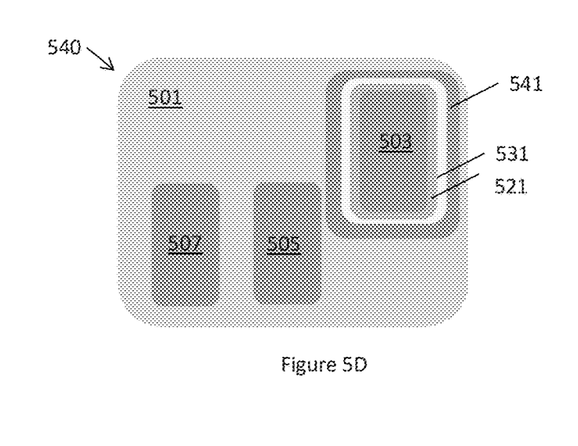

In addition, as shown in FIG. 5D, an operation, e.g., operation 305 of FIG. 3, may be performed on the system 530 to produce a system 540, where an underfill layer 541 may be formed on the package 503 and the PCB 501, adjacent to the conformal coating layer 531. In embodiments, the underfill layer 541 may not be formed on some components such as the component 505 and the component 507. The underfill layer 541 may be formed according to operation 305 as described in FIG. 3, or the operation 203 in FIG. 2. The underfill layer 531 may include an epoxy underfill.

Figure 5E:
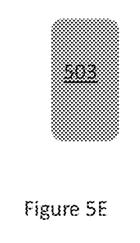

Furthermore, as shown in FIG. 5E, rework operations may be performed on the system 540 to recover the package 503. In embodiments, the rework operations may include operations shown in block 306 of FIG. 3. For example, the rework operations may include: dissolving the release agent layer in a solvent, wherein the solvent may include IPA (307); recovering the component (309); and site dressing on locations where the components are recovered (311), as shown in FIG. 3.

FIG. 6 illustrates an example computer device 600 that may employ the apparatuses and/or methods described herein (e.g., an electronic system assembled on a PCB with a conformal coating layer of FIG. 1), in accordance with various embodiments. As shown, computer device 600 may include a number of components, such as one or more processor(s) 604 (one shown) and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computing device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computer device 600 may include other components that may or may not be physically and electrically coupled to the PCB 602. These other components include, but are not limited to, memory controller 626, volatile memory (e.g., dynamic random access memory (DRAM) 620), non-volatile memory such as read only memory (ROM) 624, flash memory 622, storage device 654 (e.g., a hard-disk drive (HDD)), an I/O controller 641, a digital signal processor (not shown), a crypto processor (not shown), a graphics processor 630, one or more antenna 628, a display (not shown), a touch screen display 632, a touch screen controller 646, a battery 636, an audio codec (not shown), a video codec (not shown), a global positioning system (GPS) device 640, a compass 642, an accelerometer (not shown), a gyroscope (not shown), a speaker 650, a camera 652, and a mass storage device (such as hard disk drive, a solid state drive, compact disk (CD), digital versatile disk (DVD)) (not shown), and so forth.

In some embodiments, the one or more processor(s) 604, flash memory 622, and/or storage device 654 may include associated firmware (not shown) storing programming instructions configured to enable computer device 600, in response to execution of the programming instructions by one or more processor(s) 604, to practice all or selected aspects of the methods described herein. In various embodiments, these aspects may additionally or alternatively be implemented using hardware separate from the one or more processor(s) 604, flash memory 622, or storage device 654.

In various embodiments, one or more components of the computer device 600 may include and/or implement the electronic system 100 described herein. For example, the electronic system 100 may be included and/or implemented within the DRAM 620, the flash memory 622, the ROM 624, the storage device 654, the processor 604, the communication chip 606, the memory controller, the I/O controller 641, the graphics CPU 630, and/or the touch screen controller 646.

The communication chips 606 may enable wired and/or wireless communications for the transfer of data to and from the computer device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 600 may include a plurality of communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others.

In various implementations, the computer device 600 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 600 may be any other electronic device that processes data.

Some non-limiting Examples are provided below.

Example 1 may include an electronic apparatus, comprising: a printed circuit board (PCB); a component affixed to the PCB; a conformal coating layer on the PCB and the component, wherein the conformal coating layer includes parylene; and an underfill layer adjacent to the conformal coating layer, wherein the underfill layer is within a gap between the PCB and the component.

Example 2 may include the electronic apparatus of example 1 and/or some other examples herein, wherein the underfill layer fills the gap entirely between the PCB and the component.

Example 3 may include the electronic apparatus of example 1 and/or some other examples herein, wherein the PCB is a rigid PCB or a flex PCB.

Example 4 may include the electronic apparatus of example 1 and/or some other examples herein, wherein the underfill layer includes an epoxy underfill.

Example 5 may include the electronic apparatus of example 1 and/or some other examples herein, wherein the conformal coating layer includes parylene C.

Example 6 may include the electronic apparatus of example 1 and/or some other examples herein, wherein the conformal coating layer is optically transparent.

Example 7 may include the electronic apparatus of example 1 and/or some other examples herein, wherein the conformal coating layer has a thickness as measured in a direction perpendicular to a surface of the PCB, wherein the thickness is between approximately 4 and approximately 15 microns.

Example 8 may include the electronic apparatus of example 1 and/or some other examples herein, further comprising a gold layer between the conformal coating layer and the underfill layer.

Example 9 may include the electronic apparatus of example 1 and/or some other examples herein, further comprising a release agent layer between the PCB and the conformal coating layer, wherein the release agent layer includes tri-methylated silica or petroleum distillate.

Example 10 may include the electronic apparatus of any of examples 1-9 and/or some other examples herein, wherein the component is a package or a passive component.

Example 11 may include the electronic apparatus of example 10 and/or some other examples herein, wherein the package is a chip scale package (CSP), a wafer-level package (WLP), a quad-flat no-leads (QFN) package, a dual-flat no-leads (DFN) package, or a package with overmold mounted on the PCB.

Example 12 may include the electronic apparatus of example 10 and/or some other examples herein, wherein the package includes a non-polymeric substrate.

Example 13 may include the electronic apparatus of any of examples 1-9 and/or some other examples herein, further comprising another component affixed to the PCB and not covered by the conformal coating layer.

Example 14 may include a method of forming an integrated circuit (IC) system, comprising: forming a conformal coating layer on a printed circuit board (PCB) and on a component affixed to the PCB, wherein the conformal coating layer includes parylene; and forming an underfill layer adjacent to the conformal coating layer, wherein the underfill layer fills a gap between the PCB and the component.

Example 15 may include the method of example 14 and/or some other examples herein, wherein the PCB is a rigid PCB or a flex PCB.

Example 16 may include the method of example 14 and/or some other examples herein, wherein the underfill layer includes an epoxy underfill.

Example 17 may include the method of example 14 and/or some other examples herein, wherein the conformal coating layer includes parylene C.

Example 18 may include the method of example 14 and/or some other examples herein, wherein the conformal coating layer has a thickness as measured in a direction perpendicular to a surface of the PCB, wherein the thickness is between approximately 4 and approximately 15 microns.

Example 19 may include the method of example 14 and/or some other examples herein, wherein forming the conformal coating layer includes: vaporizing a solid dimer para-xylylene; causing pyrolysis of the vaporized dimer vapor to yield para-xylylene; and polymerizing the para-xylylene spontaneously on the PCB and the component affixed to the PCB.

Example 20 may include the method of example 14 and/or some other examples herein, wherein the component is a package or a passive component.

Example 21 may include the method of example 20 and/or some other examples herein, wherein the package is a chip scale package (CSP), a wafer-level package (WLP), a quad-flat no-leads (QFN) package, a dual-flat no-leads (DFN) package, or a package with overmold mounted on the PCB.

Example 22 may include the method of example 20 and/or some other examples herein, wherein the package includes a non-polymeric substrate.

Example 23 may include the method of any of examples 14-22 and/or some other examples herein, further comprising: forming a release agent layer on the PCB and the component, before forming the conformal coating layer, wherein the release agent layer includes tri-methylated silica or petroleum distillate.

Example 24 may include the method of example 23 and/or some other examples herein, further comprising: dissolving the release agent layer in a solvent, wherein the solvent includes isopropyl alcohol (IPA); recovering the component; and site dressing a location where the component is recovered.

Example 25 may include the method of any of examples 14-22 and/or some other examples herein, further comprising: masking another component affixed to the PCB, and wherein forming the conformal coating layer does not form the conformal coating layer on another component.

Example 26 may include an electronic system, comprising: a printed circuit board (PCB); a package affixed to the PCB, wherein the package includes a die; a conformal coating layer on the PCB and the package, wherein the conformal coating layer includes parylene; a component affixed to the PCB, wherein the component is not coated by the conformal coating layer; and an underfill layer adjacent to the conformal coating layer, wherein the underfill layer is within a gap between the PCB and the package.

Example 27 may include the electronic system of example 26 and/or some other examples herein, wherein the PCB is a rigid PCB or a flex PCB.

Example 28 may include the electronic system of example 26 and/or some other examples herein, wherein the underfill layer includes an epoxy underfill.

Example 29 may include the electronic system of example 26 and/or some other examples herein, wherein the conformal coating layer includes parylene C.

Example 30 may include the electronic system of example 26 and/or some other examples herein, wherein the conformal coating layer has a thickness as measured in a direction perpendicular to a surface of the PCB, wherein the thickness is between approximately 4 and approximately 15 microns.

Example 31 may include the electronic system of example 26 and/or some other examples herein, further comprising a gold layer between the conformal coating layer and the underfill layer.

Example 32 may include the electronic system of any of examples 26-31 and/or some other examples herein, further comprising a release agent layer between the PCB and the conformal coating layer, wherein the release agent layer includes tri-methylated silica or petroleum distillate.

Example 33 may include the electronic system of any of examples 26-31 and/or some other examples herein, wherein the package is a chip scale package (CSP), a wafer-level package (WLP), a quad-flat no-leads (QFN) package, a dual-flat no-leads (DFN) package, or a package with overmold mounted on the PCB.

Example 34 may include the electronic system of any of examples 26-31 and/or some other examples herein, wherein the package includes a non-polymeric substrate.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. An electronic apparatus, comprising:
   a printed circuit board (PCB);
   a package affixed to the PCB via a ball grid array (BGA), wherein the package includes a substrate and a die disposed on the substrate;
   a conformal coating layer disposed on the PCB and the package, wherein the conformal coating layer includes parylene and provides a coating with a thickness of about 5 microns across a surface of the PCB;
   an underfill layer disposed adjacent to the conformal coating layer, wherein the underfill layer is formed entirely fill a gap between the PCB and the package, and fully encircles the BGA; and
   a release agent layer disposed between the PCB and the conformal coating layer, wherein the release agent layer includes tri-methylated silica or petroleum distillate.

2. The apparatus of claim 1, wherein the underfill layer fills the gap between the PCB and the package.

3. The apparatus of claim 1, wherein the PCB is a rigid PCB or a flex PCB.

4. The apparatus of claim 1, wherein the conformal coating layer includes parylene C.

5. The apparatus of claim 1, wherein the conformal coating layer has a thickness as measured in a direction perpendicular to the surface of the PCB.

6. The apparatus of claim 1, wherein the package is a chip scale package (CSP), a wafer-level package (WLP), a quad-flat no-leads (QFN) package, a dual-flat no-leads (DFN) package, or a package with overmold mounted on the PCB.

7. The apparatus of claim 1, further comprising another component affixed to the PCB and free from the conformal coating layer.

8. A method of forming an integrated circuit (IC) system, comprising:
   forming a conformal coating layer on a printed circuit board (PCB) and on a package affixed to the PCB via a ball grid array (BGA), wherein the package includes a substrate and a die disposed on the substrate, wherein the forming includes providing a thickness of the conformal coating layer of about 5 microns across a surface of the PCB, wherein the conformal coating layer includes parylene;
   forming an underfill layer adjacent to the conformal coating layer, wherein the underfill layer entirely fills a gap between the PCB and the component, and fully encircles the BGA; and
   forming a release agent layer on the PCB and the package, before forming the conformal coating layer, wherein the release agent layer includes tri-methylated silica or petroleum distillate.

9. The method of claim 8, wherein the PCB is a rigid PCB or a flex PCB.

10. The method of claim 8, wherein the conformal coating layer includes parylene C.

11. The method of claim 8, wherein the conformal coating layer has a thickness as measured in a direction perpendicular to the surface of the PCB.

12. The method of claim 8, wherein forming the conformal coating layer includes: vaporizing a solid dimer para-xylylene; causing pyrolisis of the vaporized dimer vapor to yield para-xylylene; and polymerizing the para-xylylene spontaneously on the PCB and the component affixed to the PCB.

13. The method of claim 8, wherein the package is a chip scale package (CSP), a wafer-level package (WLP), a quad-flat no-leads (QFN) package, a dual-flat no-leads (DFN) package, or a package with overmold mounted on the PCB.

14. The method of claim 8, further comprising:
   dissolving the release agent layer in a solvent, wherein the solvent includes isopropyl alcohol (IPA);
   recovering the package; and
   site dressing a location where the package is recovered.

15. The method of claim 8, further comprising:
   masking another component affixed to the PCB, wherein forming the conformal coating layer includes keeping the other component free from the conformal coating layer.

16. An electronic system, comprising:
   a printed circuit board (PCB);
   a package affixed to a surface of the PCB via a ball grid array (BGA), wherein the package includes a die;
   a conformal coating layer on the PCB and the package, wherein the conformal coating layer includes parylene and provides a coating with a thickness of about 5 microns across the surface of PCB;
   a component different than the package and affixed to the surface of the PCB, wherein the component is free from the conformal coating layer; and
   an underfill layer disposed adjacent to the conformal coating layer, wherein the underfill layer is formed entirely fill a gap between the PCB and the package, and fully encircles the BGA; and
   a release agent layer disposed between the PCB and the conformal coating layer, wherein the release agent layer includes tri-methylated silica or petroleum distillate.

17. The system of claim 16, wherein the underfill layer includes an epoxy underfill.

18. The system of claim 16, wherein the conformal coating layer includes parylene C.

19. The system of claim 16, wherein the package is a chip scale package (CSP), a wafer-level package (WLP), a quad-flat no-leads (QFN) package, a dual-flat no-leads (DFN) package, or a package with overmold mounted on the PCB.

20. The system of claim 16, wherein the package includes a non-polymeric substrate.

* * * * *

UNITED STATES PATENT AND TRADEMARK OFFICE
CERTIFICATE OF CORRECTION

Page 1 of 1

PATENT NO. : 10,356,912 B2
APPLICATION NO. : 15/257726
DATED : July 16, 2019
INVENTOR(S) : Priyanka Dobriyal et al.

It is certified that error appears in the above-identified patent and that said Letters Patent is hereby corrected as shown below:

In the Claims

Column 13
Lines 27-28, "...is formed entirely fill..." should read – "...is formed to entirely fill..."

Column 14
Lines 46-47, "...is formed entirely fill..." should read – "...is formed to entirely fill..."

Signed and Sealed this
Seventeenth Day of December, 2019

Andrei Iancu
*Director of the United States Patent and Trademark Office*